United States Patent [19]

Mai et al.

[11] 3,898,105

[45] Aug. 5, 1975

[54] METHOD FOR MAKING FET CIRCUITS

[75] Inventors: Chao C. Mai; Robert B. Palmer, both of Dallas, Tex.

[73] Assignee: Mostek Corporation, Carrollton, Tex.

[22] Filed: Oct. 25, 1973

[21] Appl. No.: 409,374

[52] U.S. Cl. .................... 148/1.5; 148/187; 357/91

[51] Int. Cl. ................................................ H01l 7/54

[58] Field of Search .............. 148/1.5, 187; 317/235

[56] References Cited

UNITED STATES PATENTS

| | | | |
|---|---|---|---|
| 3,472,712 | 10/1969 | Bower | 148/187 |
| 3,653,978 | 4/1972 | Robinson et al. | 148/1.5 |
| 3,699,646 | 10/1972 | Vadasz | 148/187 X |

OTHER PUBLICATIONS

Lehman et al., "Formation of Depletion and Enhancement Mode Field Effect Transistors," IBM Tech. Discl. Bull. Vol. 8, No. 4, 9/65, p. 675–676.

Lehman et al., "Fabrication of Field Effect Transistors," IBM Tech. Discl. Bull. Vol. 8, No. 4, 9/65, pp. 677, 678.

*Primary Examiner*—C. Lovell
*Assistant Examiner*—J. M. Davis
*Attorney, Agent, or Firm*—Hubbard, Thurman, Turner & Tucker

[57] ABSTRACT

An integrated circuit and process for manufacturing same is disclosed. The integrated circuit comprises both depletion and enhancement mode field effect transistors, each having silicon gates and self-aligned gate regions. The process includes forming a thick oxide layer on the substrate, removing the thick oxide at the transistor sites, forming a thin oxide at the transistor sites, masking selected transistor sites to selectively implant ions at the other sites, depositing a polysilicon layer over the slice and patterning the polysilicon layer to form gate electrodes, removing the thin oxide using the polysilicon gate electrodes as masks, diffusing the source and drain regions, forming an insulating oxide, then applying the source drain and gate contacts and interconnects.

6 Claims, 16 Drawing Figures

METHOD FOR MAKING FET CIRCUITS

This invention relates generally to a method for fabricating an integrated semiconductor circuit and to the product resulting therefrom.

In recent years, integrated circuits utilizing field effect transistors have found increasing commercial acceptance. The simplest technology which has found commercial acceptance utilizes what is commonly referred to as MOSFETs. These devises are typically formed by making source and drain diffused regions of one conductivity type in the surface of a semiconductor substrate of the other conductivity type. An oxide insulating layer is formed over the surface of the substrate and is made thin over channel regions extending between the source and drain regions and is made thick in all other areas where insulation is required. A single metalized layer is then deposited over the oxide layer and patterned to form metal gate electrodes over the channel regions and, also, metal interconnecting circuits which, in addition to diffused interconnections, interconnect the transistors into an integrated circuit.

These MOSFET integrated circuits provide high component density and simple process technology when compared to bipolar integrated circuits. MOSFET circuits were initially characterized by high threshold voltages and limitations upon the circuit design because only enhancement mode devices could be formed on a single substrate when using the simple process of fabrication. Ion implantation techniques have been used to enhance circuit performance by providing both depletion mode and enhancement mode transistors on the same integrated circuit, and also to lower the threshold voltages of enhancement mode transistors so that the circuit will be compatible with bipolar integrated circuits. Another technology has found commercial acceptance which utilizes polycrystalline silicon as the gate electrode of the field effect devices. This technology offers the advantages that the gate electrode is self-aligning with the drain and source of the device, thus defining the length of the channel, so that the gate capacitance is reduced and the speed of the circuit accordingly increased.

The present invention is concerned with an improved process for fabricating an integrated circuit which has field effect devices with low threshold voltages to permit the circuits to be used compatibly with bipolar integrated circuits, which have self-aligned gate structures so as to reduce capacitance and thus improve speed, which may have an additional interconnecting layer that can result in greater functional density, and which also may have both enhancement mode and depletion mode transistors on the same substrate to thereby provide an improved speed-power product and increased functional density, as well as improved circuit performance.

In accordance with the method of the present invention, an integrated circuit in accordance with this invention is fabricated by forming a relatively thick oxide layer on a semiconductor substrate. The thick oxide layer is removed at the sites where transistors are to be formed. Then a thin oxide layer is formed at each of the transistor sites. The transistor sites are then selectively masked so that only selected transistor sites will receive effective ion implantation doses. The substrate is then subjected to ion bombardment to provide an impurity concentration selected to either provide depletion mode channels at the selected transistor sites, or to provide enhancement mode channels with lower threshold voltages. Two or more successive ion implant steps can be performed on selected transistor sites so as to provide some transistors having low threshold enhancement mode operation and other transistors having depletion mode operation on the same substrate. A polycrystalline silicon layer is then deposited over the slice and patterned using selective etching techniques to form gate electrodes. The thin oxide is then removed from the silicon substrate so that the first thick oxide layer and the polysilicon layer form a diffusion mask through which source and drain diffusions are made. A final insulating oxide layer is applied and patterned to provide contact with the source, drain, and gate regions. A metalized layer is then deposited and patterned to interconnect the source drain and gate regions of the individual transistors into an integrated circuit. The diffused regions and also the silicon gate layer may also be used as interconnect levels, thus providing a three-level interconnect circuit.

The integrated circuit, in accordance with the present invention, includes a plurality of field effect transistors each having source and drain regions of a conductivity type opposite that of the substrate, and defining a channel region therebetween, at least a portion of the channel region having implanted ions at a different level than other channel regions, an oxide layer having a relatively thin region over the channel regions to permit activation of the channel regions and relatively thick regions elsewhere to prevent the activations of field regions thereunder, polycrystalline silicon regions overlaying the channel regions and forming gate electrodes, and a conductive interconnect system interconnecting the source, drain and gate regions into an integrated circuit.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
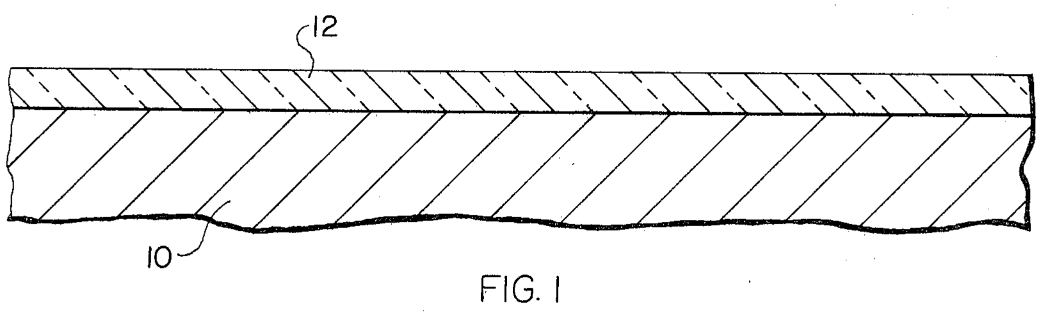
FIGS. 1 through 12 are schematic sectional views illustrating successive steps of the process of the present invention.
Figure 2:
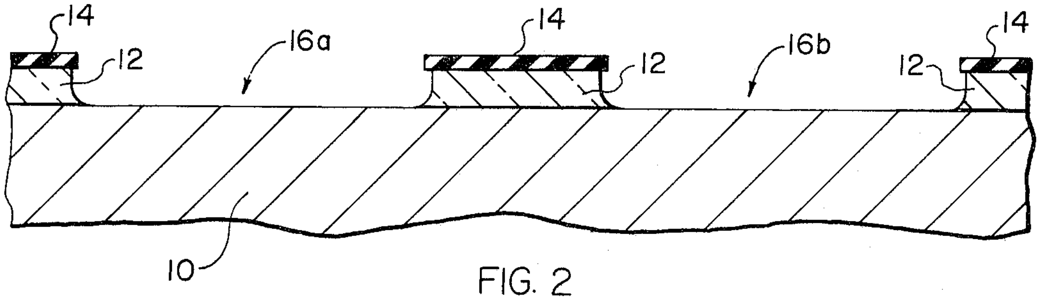

Referring now to the drawings, and in particular to FIG. 1, a semiconductor substrate 10 is the starting material for the process of the present invention. The semiconductor substrate 10 is typically silicon and may have either n-type or p-type conductivity. However, the semiconductor substrate 10 may be any conventional type used in the fabrication of metal-insulator-semiconductor field effect devices; the crystal orientation and doping levels being conventional and well-known.

The semiconductor substrate 10 is placed in a conventional oxidizing furnace and an oxide layer 12 thermally grown to a typical thickness of 6,000 A for n-channel devices or 15,000 A for p-channel devices. Next, a photoresist layer is applied to the oxide layer 12 and patterned using conventional photo-lithographic techniques to provide an etching mask 14 through which the underlying oxide layer 12 is removed using a conventional selective etching solution at each transistor site, where transistors are to be formed, for example, transistor sites 16*a* and 16*b*. The etching mask 14 is then stripped from the oxide layer 12.

Figure 3:
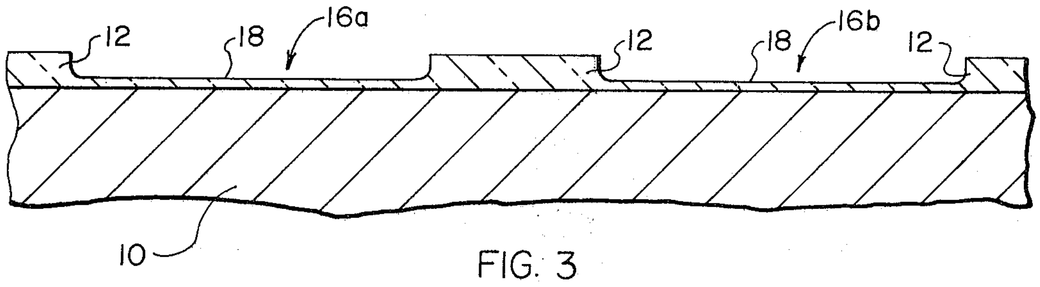
Figure 4:
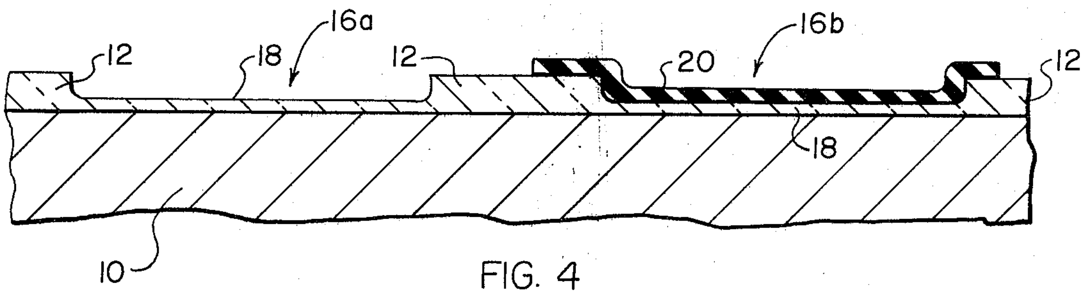

The semiconductor substrate 10 is again placed in an oxidizing furnace and a thin gate oxide layer 18 thermally grown on the surface of the semiconductor substrate 10 to a thickness of from 600 A to 2,000 A to form the gate insulators for the transistors. This produces a wafer as illustrated in FIG. 3. Next, the wafer is again coated with photoresist which is patterned to leave a photoresist mask 20 at each transistor site where no ion implantation is desired, as illustrated in FIG. 4. If desired, the photoresist mask 20 can be a metalized layer patterned by conventional photolithographic techniques.

Figure 5:
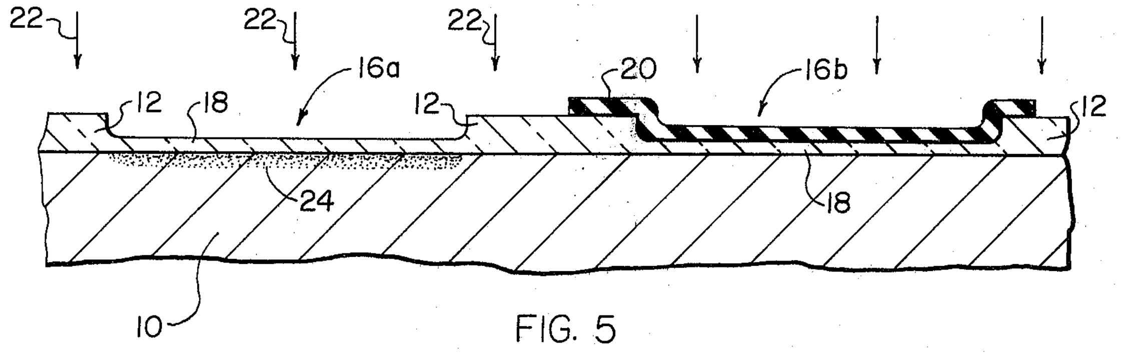

Next, the wafer is placed in ion implantation equipment and the surface of the wafer subjected to bombardment over its entire surface as represented by the arrows 22 in FIG. 5. The power of the ions is selected so as to penetrate the thin gate oxide layer 18 at the site 16*a* which is not protected by the photoresist mask 20 and lodge in the semiconductor substrate 10 near the surface as represented by the region 24. However, the ions do not have sufficient velocity to penetrate the photoresist mask 20, or the thick oxide layer 12 which covers the remainder of the slice other than the transistor sites. As a result, the ions are implanted only at those transistor sites which were left unprotected and the operating characteristics of which are to be changed. The level of ion implantation can be selected so as to merely lower the threshold voltage of enhancement mode devices, or can be chosen so as to actually convert the conductivity type of the semiconductor substrate 10 to provide depletion mode devices. The concentration of the ion implantation or dose will hereafter be discussed in greater detail in connection with FIGS. 14–16.

The ions may be derived from boron compounds, such as $BF_3$ to produce p-channel devices, or from phosphorous compounds, such as $PH_4$ to produce n-channel devices. Equipment for such ion implantation is commercially available, and its use for implantation purposes is known in the industry.

Figure 6:
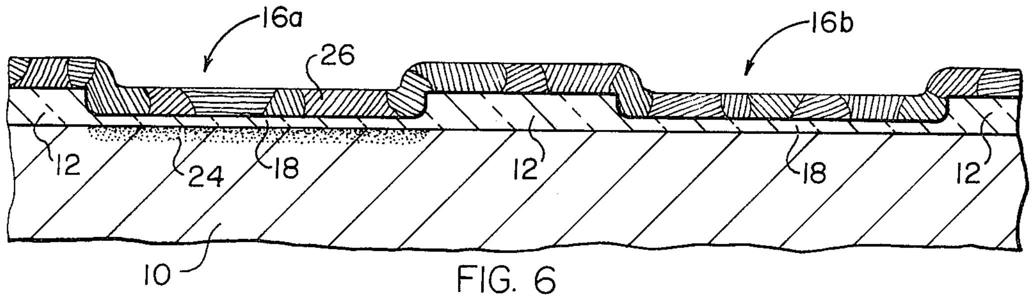

Next, the photoresist mask 20 is stripped from the semiconductor substrate 10 and a layer of polycrystalline silicon layer 26 deposited on the surface of the oxide layer 12 and thin gate oxide layer 18 as illustrated in FIG. 6.

The polycrystalline silicon layer 26 may be formed by any suitable conventional process, such as by the decomposition of $SiH_4$ (silane), in a cold wall epitaxial reactor or in a hot wall furnace. The polycrystalline silicon layer 26 is typically from 3,000 A to 6,000 A in thickness.

Next, a silicon oxide layer 28 is deposited on the polycrystalline silicon layer 26 using conventional deposition processes.

Figure 7:
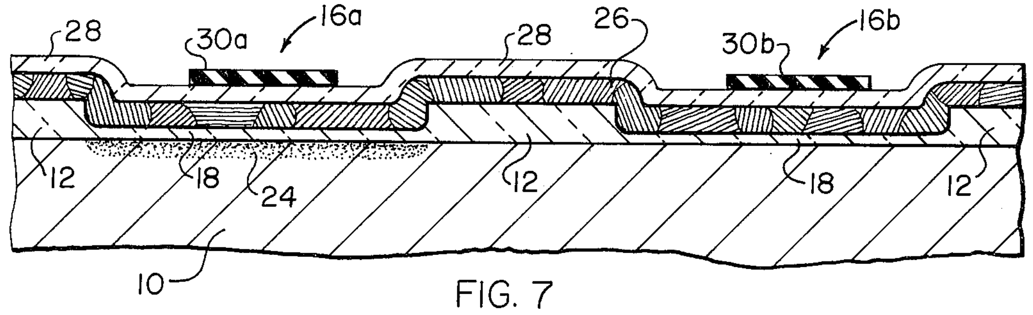
Figure 8:
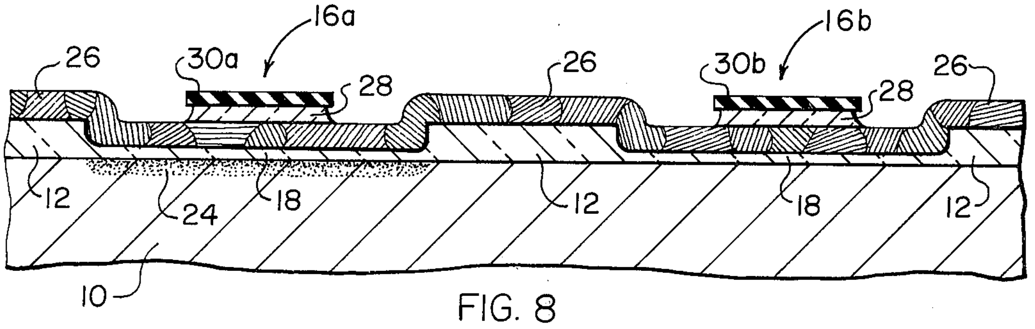

Then a layer of photoresist is applied to the silicon oxide layer 28 and patterned using conventional photographic techniques to leave photoresist areas 30*a* and 30*b* which define the gate geometries of the transistors for the transistor sites 16*a* and 16*b*, respectively, as indicated in FIG. 7. The semiconductor substrate 10 is then subjected to a selective etch solution which preferentially etches the silicon oxide layer 28, but not the underlying polycrystalline silicon layer 26, thus leaving the structure illustrated in FIG. 8.

Figure 9:
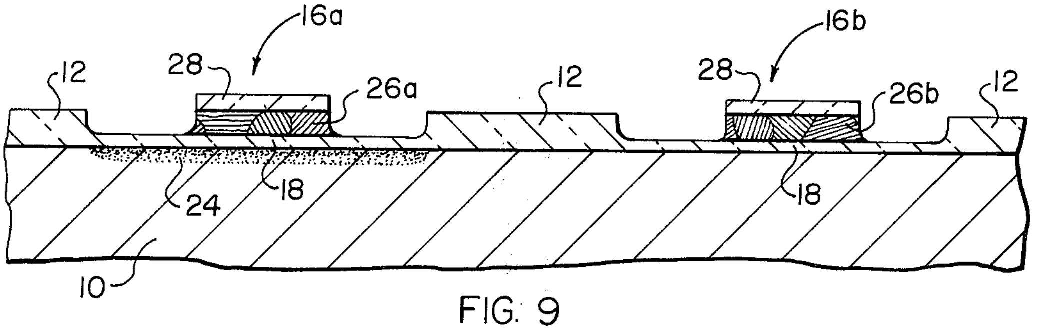

Next, the photoresist areas 30*a*–30*b* are stripped and the slice subjected to an etch solution which preferentially attacks the polycrystalline silicon layer 26 but not the silicon oxide layer 28. This results in the removal of the polycrystalline silicon layer 26 in all areas except the gate areas 26*a* and 26*b*, as illustrated in FIG. 9, which will ultimately be the gate electrode of the transistor. The gate areas 26*a* and 26*b* also function as an etching and diffusion mask for the source, drain and interconnect diffusion step presently to be described.

Figure 10:
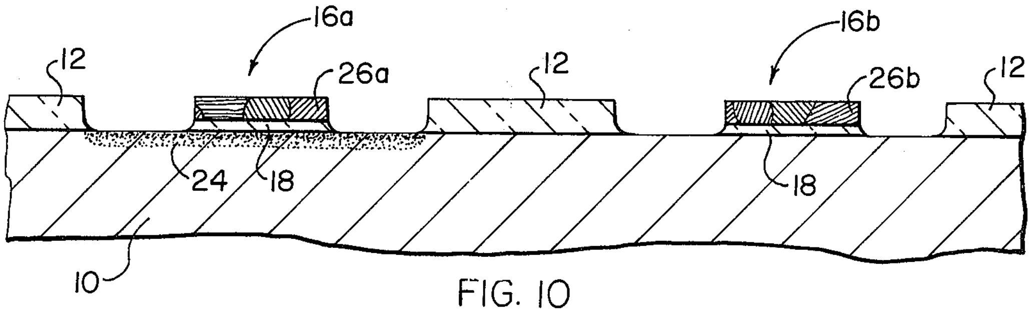
Figure 11:
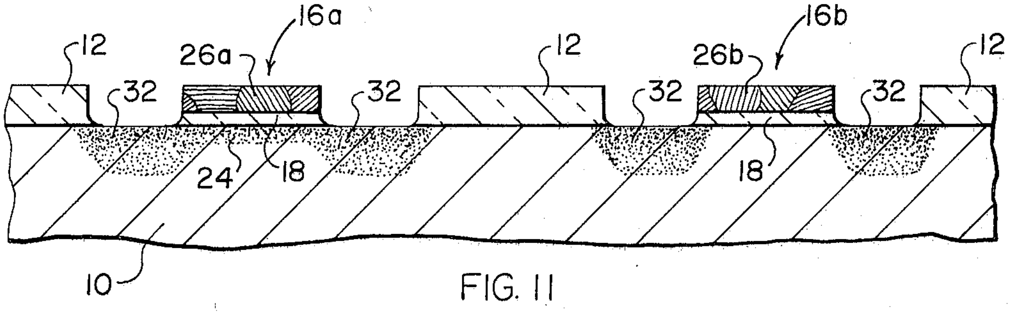

Next, the substrate is subjected to an etching solution which selectively attacks the oxide layer 12 and thin gate oxide layer 18, but not the polycrystalline silicon area 26*a* and 26*b*. The duration of this etch is controlled so that only the thin gate oxide layer 18 of the oxide that is exposed at the transistor sites 16*a* and 16*b* is removed, and the thick oxide layer 12 is left at a substantial thickness as illustrated in FIG. 10. This results in the semiconductor substrate 10 being exposed only in the areas where a diffusion is to be made for source and drain region or for lower level interconnects, in which areas the thin oxide layer was also previously formed. Conventional impurity sources for this diffusion step may be used, such as boron compounds, $BBr_3$ and $B_2H_6$ for p-channel devices and phosphorous compounds for n-channel devices.

Figure 12:
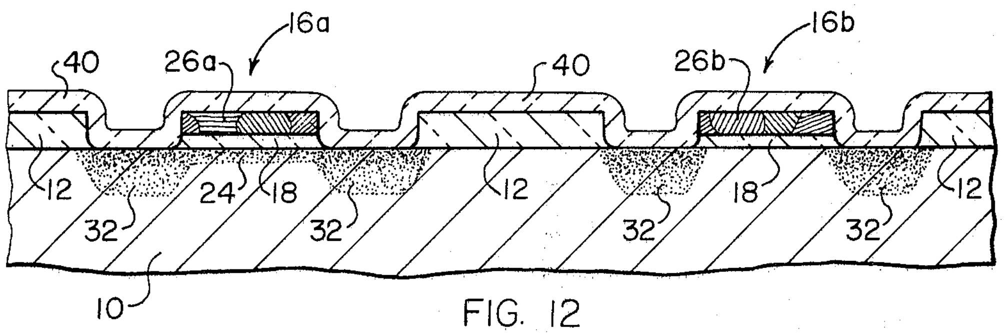

Next an oxide layer 40 is again deposited over the surface of the slice as illustrated in FIG. 12 by a conventional low temperature process. Openings are then made in the oxide layer 40 using conventional photolithographic techniques. A metal film is deposited over the oxide layer 40 in the openings, and is patterned to produce the structure illustrated in FIG. 13 having source and drain contacts 42 and gate contacts 44 for the transistors at sites 16*a* and 16*b*. The device illustrated in FIG. 12 may include a final silicon dioxide passivating layer (not illustrated) deposited over the entire structure, except for over bonding pads at the periphery of the chip.

Figure 13:
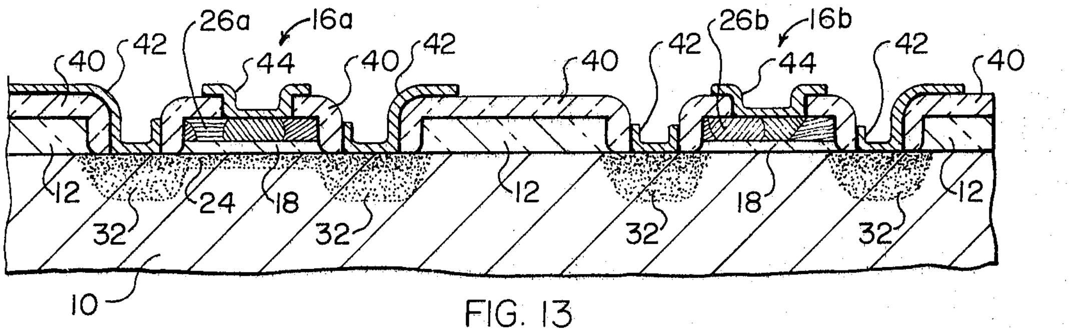
FIG. 13 is a schematic sectional view illustrating the product produced by the process of the present invention.

The device of FIG. 13 may provide low threshold voltage operation that results in compatibility with bipolar integrated circuits if all or a portion of the transistors are subjected to ion implantation doses of a limited level. The self-aligned gate structure provided by using the polycrystalline silicon gates as the etching mask for removing the oxide layer reduces capacitance and thus significantly increases the speed of operation of the circuit. The polycrystalline silicon layer can also be used as an interconnecting conductor, and thus can provide a third layer of interconnection to increase the functional density of the integrated circuit. The use of both enhancement mode (some or all with reduced threshold voltages, if desired) and depletion mode devices on the same chip provide an improved speed power product and further increase functional density due to simplified circuit design and reduction in the size of certain transistors in the circuit, particularly load transistors.

Figure 14:
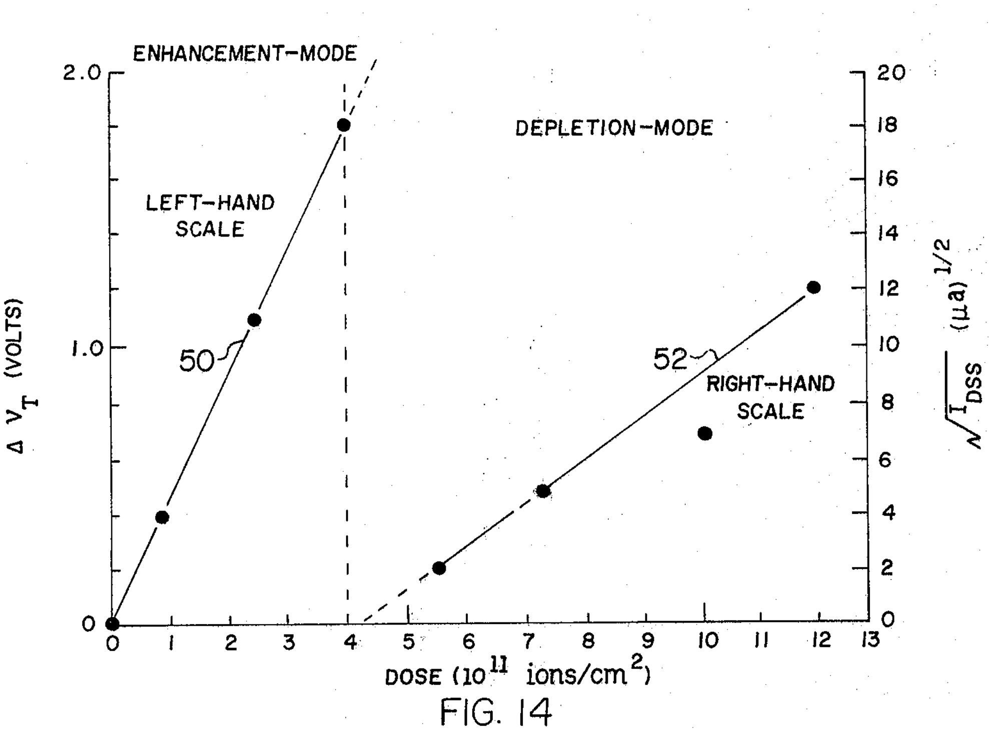
FIGS. 14, 15 and 16 are graphs illustrating the operating characteristics of the circuits produced by the process of the present invention.

It was found that the shift in threshold voltage was proportional to the implanted ion dose, and that depletion mode devices were produced by ion doses in excess of $4 \times 10^{11}$ ions per square centimeter. FIG. 14 shows the behavior of two parameters as a function of ion dose. Curve 50, using the left hand ordinate scale, shows the variation of the threshold voltage $\Delta V_T$, measured at the drain current of 1 microampere with increasing ion concentration. It will be noted that at an approximate ion dose of $2\times10^{11}$ ions per square centimeter, the threshold voltage $V_T$ has shifted by 0.95 volts towards zero, i.e., lowered in magnitude. At approximately $4\times10^{11}$ ions per square centimeter, $\Delta V_T$ exceeds 1.9 volts, a shift sufficiently to cause the transistors to function in the depletion mode, that is, to be conductive with zero gate voltage. Curve 52, which uses the right hand ordinate scale, indicates the increase $(I_{DSS})^{1/2}$ as a function of increasing ion concentration. The square root of $I_{DSS}$ is used because it is proportional to the pinch off voltage, but may be more conveniently measured with a curve tracer than the pinch off voltage which is $I_{DS}=K'(W/L)V_P^2$ for zero gate bias. It will be noted that $(I_{DSS})^{1/2}$ is also proportional to the ion dose.

Figure 15:
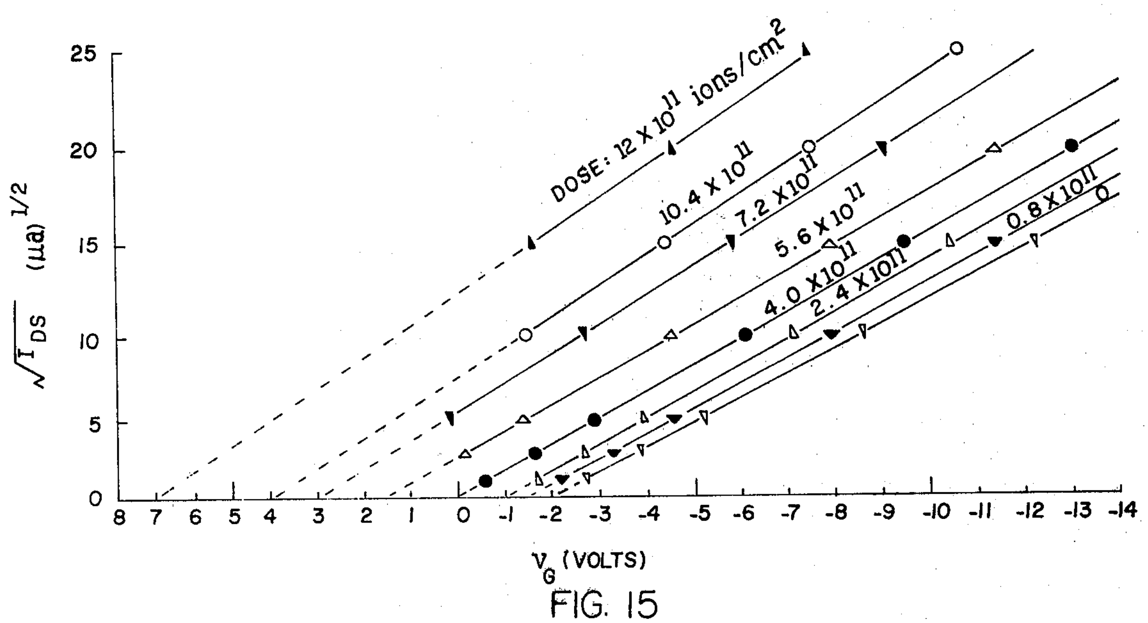

FIG. 15 illustrates variations in the square root of $I_{DS}$, the drain to source current, as a function of the gate to source voltage $V_G$ for the transistors of the present invention for different implanted ion concentrations. It was found that as the ion concentration increases, the lines move to higher current levels, but the slopes of the lines remain unchanged. From this, it can be concluded that the ion implantation under these conditions and these ranges of concentration has little effect on the trans-conductants of the transistor devices.

Figure 16:
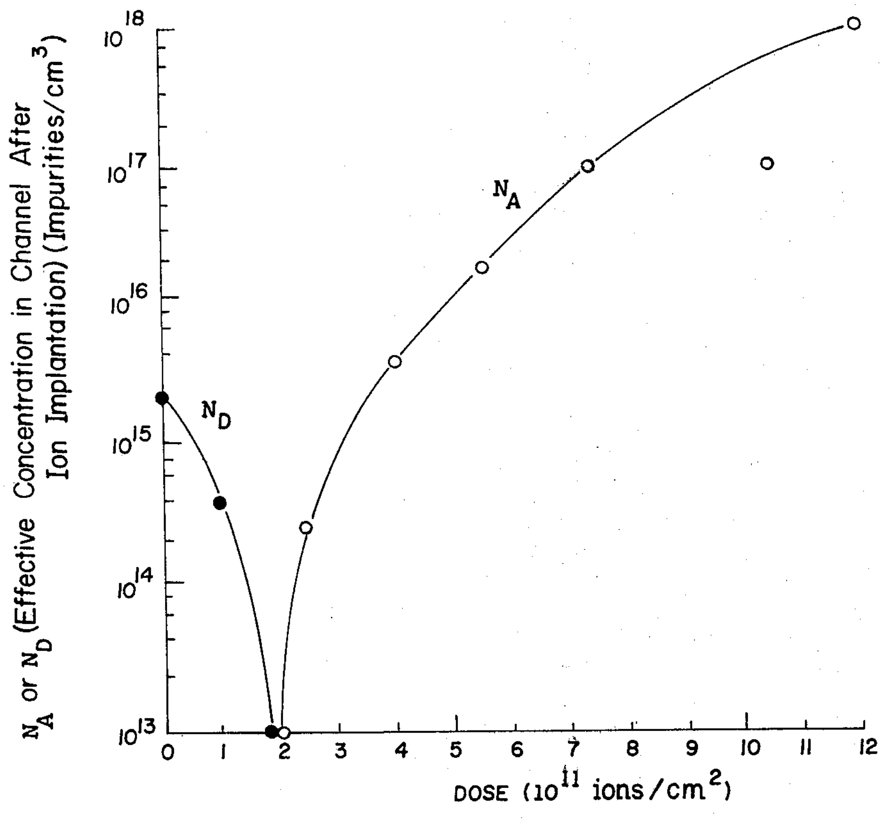

The effective doping concentration on the channel after ion implantation can be derived theoretically from the pinch-off voltage, and this is plotted in FIG. 16. An n-type silicon substrate having an initial impurity concentration of $2\times10^{15}$ ions per cubic centimeter becomes converted to p-type by an implanted boron dose of about $1.9\times10^{11}$ ions per centimeter square at 44 keV.

Although preferred embodiments of the invention have been described in detail, it is to be understood that the invention is not limited to the embodiments disclosed, but is capable of numerous rearrangements, modifications, and substitutions of parts and elements without departing from the spirit of the invention.

What is claimed is:

1. The method for producing an integrated circuit which comprises:

forming an ion implantation mask on the surface of a semiconductor substrate including an oxide layer having first areas penetrable by ions of a predetermined energy and second areas not penetrable by ions of said predetermined energy, said first areas being positioned over the channel regions of transistors the channel conductance of which is to be modified from that provided by the substrate, exposing the masked substrate to a source of ions having said predetermined energy for a predetermined period to modify the substrate in the channel region in a predetermined manner, forming a diffusion mask including a layer of semiconductor material and the oxide layer, the diffusion mask defining the source and drain regions of transistors with the layer of semiconductor material being patterned to define the edges of channel regions of transistors, diffusing ions through the diffusion mask to form the source and drain regions for the transistors, and interconnecting the source and drain regions and the layers of semiconductor material to form an integrated circuit.

2. The method of claim 1 wherein the ion implantation mask comprises a layer of an oxide of the semiconductor substrate having relatively thin areas at transistor sites and diffused conductor sites and relatively thick areas elsewhere and an additional masking layer over only selected transistor sites.

3. The method of claim 2 wherein the diffusion mask is comprised of the relatively thick areas of the oxide mask and relatively thin areas of the oxide mask over which a layer of semiconductor material forming the gate nodes of the transistors lies, the edges of the relatively thin areas of the oxide mask being substantially delineated by the edges of the layer of semiconductor material.

4. The method for producing an integrated circuit having a plurality of field effect transistors having different modes of operation comprising:

forming an oxide layer on the surface of semiconductor substrate having relatively thin areas defining a plurality of transistor sites each including source, drain and channel regions, and also diffused interconnect paths, and thick areas over substantially the remainder of the portion of the substrate forming the integrated circuit, forming an ion implantation mask on the surface of the oxide layer having openings over the thin areas of the oxide layer defining transistor sites the channel conductance of which is to be modified by ion implantations, subjecting the substrate to a source of ions having a predetermined kinetic energy selected to cause the ions to penetrate the relatively thin oxide layer exposed by the ion implantation mask and lodge in the surface region of the substrate, depositing a layer of polycrystalline semiconductor material over the surface of the oxide layer and patterning the semiconductor layer to form the gate nodes of the respective transistors, the gate nodes overlying the areas of the oxide layer that are relatively thin and delineating the areas of the channels of the respective transistors, removing the relatively thin areas of the oxide layer which are not covered by the layer of semiconductor material but not the relatively thick areas to leave the substrate exposed in areas defining the source and drain regions of the transistors and the diffused interconnect paths of the integrated circuit, diffusing impurities through the exposed areas of the surface of the substrate until the regions of the substrate underlying the exposed surface areas are converted to the opposite conductivity-type, depositing a second oxide layer over the substrate structure and removing portions of the second oxide layer to leave selected gate, source and drain nodes exposed, and forming a plurality of conductive interconnects between the exposed nodes to form an integrated circuit.

5. The method for producing an integrated circuit having a plurality of enhancement mode field effect transistors and a plurality of depletion mode transistors comprising:

forming an oxide layer on the surface of semiconductor substrate having relatively thin areas defining all transistor sites, each site including the source, drain and channel regions of the respective transistor, and relatively thin areas defining diffused interconnect paths, and thick areas over substantially the remainder of the portion of the substrate forming the integrated circuit, forming an ion implantation mask on the surface of the oxide layer having openings over the thin areas of the oxide layer defining depletion mode transistor sites and covering the thin areas of the oxide layer defining enhancement mode transistor sites, subjecting the substrate to a source of ions having a predetermined kinetic energy selected to cause the ions to penetrate the relatively thin oxide layer exposed by the ion implantation mask, and to lodge in the surface region of the substrate, the number of ions being selected to convert the channel from enhancement mode operation to depletion mode operation, depositing a layer of semiconductor material over the surface of the oxide layer and patterning the semiconductor layer overlying the thin areas of the oxide layer to form the gate nodes of the transistors and delineating the channels of the respective transistors, removing the relatively thin areas of the oxide layer which are not covered by the layer of semiconductor material to leave the substrate exposed in areas defining the source and drain regions of the transistors and the diffused interconnect paths of the integrated circuit, diffusing impurities through the exposed surface into the substrate until regions of the substrate underlying the exposed surface are converted to the opposite type conductivity, depositing an oxide layer over the substrate and removing portions of the oxide layer to leave selected gate, source and drain nodes exposed, and forming a plurality of conductive interconnects between the exposed nodes to form an integrated circuit.

6. The method for producing an integrated circuit having a plurality of enhancement mode field effect transistors and a plurality of depletion mode devices comprising:

thermally growing a relatively thick oxide layer on the surface of semiconductor substrate, selectively removing the relatively thick oxide layer at a plurality of transistor sites each including source, drain and channel regions of the respective transistors, and along paths defining diffused interconnect paths, and then thermally regrowing a relatively thin oxide layer over the transistors sites and interconnect paths, forming an ion implantation mask on the surface of the oxide layer having openings over the areas of the relatively thin oxide layer defining depletion mode transistor sites and covering the areas of the relatively thin oxide layer defining enhancement mode transistor sites, subjecting the substrate to a source of ions having a predetermined kinetic energy selected to cause the ions to penetrate the relatively thin oxide layer exposed by the ion implantation mask and to lodge in the surface region of the substrate, the number of ions being selected to convert the channel from enhancement mode operation to depletion mode operation, depositing a layer of semiconductor material over the surface of the oxide layers, and patterning the semiconductor layer overlying the thin areas of the oxide layer to form the gate nodes of the transistors and delineate the channels of the respective transistors, subjecting the substrate structure to a selective etching solution to remove the relatively thin areas of the oxide layer which are not covered by the layer of semiconductor material but not the relatively thick areas to leave the substrate exposed in areas defining the source and drain regions of the transistors and the diffused interconnect paths of the integrated circuit, diffusing impurities through the exposed surface into the substrate until regions of the substrate underlying the exposed surface are converted to the opposite type conductivity, depositing an oxide layer over the substrate and removing portions of the oxide layer to leave selected gate, source and drain nodes exposed, and forming a plurality of conductive interconnects between the exposed nodes to form an integrated circuit.

* * * * *